(12) United States Patent
Oshinowo

(10) Patent No.: US 6,240,938 B1
(45) Date of Patent: Jun. 5, 2001

(54) DEVICE FOR TREATING SUBSTRATES IN A FLUID CONTAINER

(75) Inventor: John Oshinowo, Schwenningen (DE)

(73) Assignee: STEAG Microtech GmbH (DE)

( * ) Notice: Subject to any disclaimer, the term of this patent is extended or adjusted under 35 U.S.C. 154(b) by 0 days.

(21) Appl. No.: 08/761,717

(22) Filed: Dec. 6, 1996

(30) Foreign Application Priority Data

May 29, 1996 (DE) .............................................. 196 21 587

(51) Int. Cl.$^7$ ...................................................... B08B 3/12
(52) U.S. Cl. ........................ 134/147; 134/184; 134/186; 134/902
(58) Field of Search ................... 134/902, 198, 134/184, 155, 186, 137, 140, 147

(56) References Cited

U.S. PATENT DOCUMENTS

| | | | |
|---|---|---|---|
| 3,276,459 | * 10/1966 | Harrison | 134/140 |
| 3,702,795 | * 11/1972 | Wessells et al. | 134/184 |
| 4,671,206 | * 6/1987 | Hoppestad et al. | 134/184 |
| 4,899,767 | * 2/1990 | McConnell et al. | 134/902 |
| 4,902,350 | 2/1990 | Steck . | |
| 5,088,510 | * 2/1992 | Bannon | 134/184 |
| 5,100,476 | * 3/1992 | Mase et al. | 134/184 |
| 5,133,376 | * 7/1992 | Samarin | 134/184 |
| 5,261,431 | 11/1993 | Ueno et al. . | |
| 5,275,184 | 1/1994 | Nishizawa et al. . | |
| 5,286,657 | 2/1994 | Bran . | |
| 5,327,921 | 7/1994 | Mokuo et al. . | |
| 5,427,622 | * 6/1995 | Stanasolovich et al. . | |
| 5,488,964 | 2/1996 | Murakami et al. . | |
| 5,520,205 | * 5/1996 | Guldi et al. . | |
| 5,593,505 | * 1/1997 | Erk et al. | 134/902 |
| 5,626,159 | * 5/1997 | Erk et al. | 134/902 |

FOREIGN PATENT DOCUMENTS

| | | | |
|---|---|---|---|
| 4413077 | 10/1995 | (DE) . | |
| 4428169 | 2/1996 | (DE) . | |
| 60-130832 | * 7/1985 | (JP) . | |
| 61-189647 | * 8/1986 | (JP) . | |
| 1-304733 | * 12/1989 | (JP) | 134/902 |
| 2-117135 | * 5/1990 | (JP) | 134/902 |
| 347578 | 2/1991 | (JP) . | |
| 3-66124 | * 3/1991 | (JP) | 134/137 |
| 3-231428 | * 10/1991 | (JP) | 134/902 |
| 4-37131 | * 2/1992 | (JP) | 134/902 |
| 4245432 | 9/1992 | (JP) . | |
| 5-129268 | * 5/1993 | (JP) | 134/902 |
| 9502473 | 1/1995 | (WO) . | |

OTHER PUBLICATIONS

IBM Technical Disclosure Bulletin; vol. 34, No. 5, Oct. 1991 p. 331.

* cited by examiner

*Primary Examiner*—Frankie L. Stinson
(74) *Attorney, Agent, or Firm*—Robert W. Becker & Associates

(57) ABSTRACT

A treatment apparatus for treating substrates includes a fluid container and a device for moving in a reciprocating manner the substrates within the fluid container during treatment to thereby make accessible areas of the substrates that would otherwise be obstructed by parts of the device.

24 Claims, 2 Drawing Sheets

DEVICE FOR TREATING SUBSTRATES IN A FLUID CONTAINER

BACKGROUND OF THE INVENTION

The present invention relates to a device for treating substrates in a fluid container.

Devices of this kind are, for example, known from U.S. Pat. No. 5,275,184, International Patent Application (PCT) WO 95/02473 and German Patent Application 44 13 077. The wafers in these arrangements are stationarily and fixedly arranged within the fluid container during treatment. Upon introduction of the treatment fluid, for example, a chemical or a cleaning fluid, via an inlet opening or fluid nozzles, flow conditions vary locally so that flow crossing points or dead angles result which are caused by the predetermined fluid flow or spray angles.

Upon treatment of the substrates with ultrasound, for example, for improving and accelerating the cleaning process, a uniform subjection of the substrates to sound is not possible with the known devices because the soundwave cones cause different sound intensities or dead angles. In the device known from WO 95/02473, the ultrasound generating devices are provided at the sidewalls. In order to improve the uniform subjection of the substrates to sound, the guide devices for the substrates are arranged in a staggered arrangement at the inner surface of the sidewalls of the fluid container. This provides only to a limited extent a more uniform subjection of the substrates to sound because these guide devices, which are positioned opposite to the ultrasound generating devices, cause different sound intensities due to the resulting damping effect within areas having guides and within areas free of these guides.

It is therefore an object of the present invention to provide a device of the aforementioned kind with which an improved, more uniform, and/or more intensive treatment of the substrates is possible.

SUMMARY OF THE INVENTION

A treatment apparatus for treating substrates according to the present invention is primarily characterized by:

A fluid container; and

A device for moving in a reciprocating manner the substrates within the fluid container during treatment.

The device preferably moves the substrates vertically.

The device comprises at least one substrate receiving element connected within the container and the substrates are preferably positioned on the substrate receiving element.

The substrate receiving element is preferably a stay positioned below the substrates such that the substrates rest on the stay. The stay extends preferably perpendicularly to the end faces of the substrates.

The substrate receiving element may comprise a holding area for the substrates. The container has preferably sidewalls and the inner surface of at least one of the sidewalls is provided with guides for the substrates.

The guides are preferably in the form of slots, stays, pins, and/or knobs.

The inner surface of the at least one sidewall comprises advantageously areas free of such guides.

The areas free of guides comprise treatment elements such as inlet openings, spray nozzles, diffusors, UV light sources, and/or ultrasound generating devices.

The substrate receiving element may have at least two holding areas.

The substrate receiving element may comprise securing elements for securing the substrates.

The substrate receiving element may comprise slots.

The slots have preferably a shape matching the edge contour of the substrates.

The slots have an opening and a bottom. The width of the slots decreases from the opening to the bottom.

Advantageously, each one of the slots has a first sidewall and a second sidewall and the first sidewall extends preferably vertically while the second sidewall is positioned at a slant.

The apparatus may comprise a rotating device connected to the container for rotating the substrates during treatment.

Preferably, the apparatus further comprises at least one substrate securing device connected within the container for securing the substrates at an upper edge thereof.

Expediently, the container comprises a bottom and sidewalls, wherein at least one of the bottom and the sidewalls is embodied as an ultrasound generating device. Preferably, the ultrasound generating device may comprises areas having fluid nozzles attached thereto. The fluid nozzles are connected to the ultrasound generating device so as to allow sound transmission, or, in the alternative, the fluid nozzles and the ultrasound generating device may also be sound-insulated from one another. The fluid nozzles are then preferably positioned in a sound-proofing material.

The container comprises a bottom and sidewalls, wherein at least one of the bottom and the sidewalls has a first portion embodied as an ultrasound generating device and a second portion comprising fluid nozzles. The fluid nozzles are connected to the ultrasound generating device so as to allow sound transmission, or, in the alternative, the fluid nozzles and the ultrasound generating device are sound-insulated from one another. The fluid nozzles are then preferably positioned in a sound-proofing material.

Advantageously, the sound proofing material may be strip-shaped and the ultrasound generating device may have matching strip-shaped cutouts into which the sound-proofing material is inserted.

According to the present invention, the substrates within the fluid container can be moved during the treatment process. Thus, it is possible to change the position of substrates areas that during the treatment process cannot or can be reached only with difficulty by the treatment fluid, ultrasound and/or a light beam so that even these difficult to reach substrate areas are subjected to an improved exposure to the fluid or sound, respectively, radiation cone during the treatment. Dead angles or areas with varying intensity are thus compensated or avoided.

According to another advantageous embodiment of the invention, the substrates within the fluid container can be lifted and lowered (vertically reciprocated) during the treatment. In this manner, individual substrate areas are subjected to varying impact efficiencies of the fluid, ultrasound and/or light radiations so that overall a more uniform treatment of the substrates across the substrate surface is possible.

Preferably, the fluid container comprises a substrate receiving device in the form of a comb-shaped stay which is positioned below the substrates and extends perpendicular to the substrate end faces whereby the substrates rests on this stay. In this embodiment, at least one sidewall, respectively, its inner surface, is provided with guides for the substrates which are preferably in the form of slots, in the form of slotted transverse stays, pins, and/or knobs.

The irregularities resulting from the guides during the treatment of the substrates within the fluid container are inventively avoided or substantially reduced by moving the substrates, for example, by lifting and/or lowering the substrates within the fluid container while the substrates are being subjected to a fluid, ultrasound or light, for example, UV light. The areas which are not subjected to the treatment medium or subjected only to a limited extend are moved by the displacement of the substrates within the fluid container into the effective range of the treatment medium with improved exposure. Dead angles or areas with reduced impacting intensity are thus compensated during treatment of the substrates.

The guides for the substrates at the inner surfaces of the sidewalls of the fluid container, preferably in the form of slots, stays, pins and/or knobs, can be arranged such that areas without such guides are provided at the inner surfaces of the sidewalls, whereby preferably a staggered arrangement relative to the areas with guides is provided. In these areas free of guides inlet openings, spray nozzles, diffusors, ultrasound generating devices, UV light sources and/or further devices for treating the substrates are preferably provided.

According to an especially advantageous embodiment of the invention, the movable substrate receiving device of the fluid container comprises at least two holding areas for securing the substrates. Thus, it is possible to secure the substrates within the fluid container without using guides at the inner surfaces of the sidewalls. In this manner, no relative movement and thus friction results between the substrates and the fluid container devices so that possible wear or the formation of abraded particles which might cause contamination of the substrate surfaces is substantially reduced.

In order to be able to secure the substrates at the substrate receiving device without requiring guides within the fluid container, the receiving device is provided with slots, for example, within two spaced stays. The slots are preferably shaped complementary to the edge shape of the substrates and have preferably a width that decreases from the slot opening to the slot bottom. In this manner, a secure positioning and holding of the substrates within the stays provided with slots is achieved. The securing and positioning stability of the substrates within the substrate receiving device is furthermore improved by having one sidewall of the slot positioned vertically and a second sidewall of the slot slanted at a certain angle relative to the vertical. The substrate receiving device is disclosed in detail in German Application 44 28 169 as well as in German Application 196 15 108 as well as in German Application 196 16 402. The disclosure of these applications is incorporated by reference into the present specification.

Especially in connection with a substrate receiving device for securing the substrates without guides within the fluid container, it is advantageous to provide at the upper side of the substrates a corresponding substrate holding device preferably in the form of a substrate holding stay or in the form of a device which, corresponding to the substrate receiving device, is provided with at least two holding areas for securing the substrates. In this manner, the substrates are securely held within the fluid container in case that according to an especially advantageous embodiment of the invention the substrates are rotatable in addition to, or in the alternative to, the lifting and lowering movement. Due to the secure holding of the substrates within the substrate receiving device without requiring guides at or within the sidewalls of the container, it is possible to rotate the substrates continuously or about a certain angle in a reciprocating manner during treatment of the substrates, for example, by ultrasound. Friction or contact between the moving substrates and parts of the fluid container is thus prevented so that abraded particles will be formed in a reduced amount or will not be produced at all.

According to an especially advantageous embodiment of the invention the bottom of the fluid container and/or at least one sidewall of the fluid container is embodied as a sound generating device. The entire bottom, respectively, the entire sidewall in such an embodiment is in the form of a sound source so that a very uniform sound treatment of the substrates is possible within the fluid container.

Preferably, the container bottom and/or container sidewalls in the form of ultrasound generating devices have fluid nozzles, preferably in the form of strip-shaped areas are provided. It is also possible to embody the container bottom and/or at least one of the container sidewalls as a fluid nozzle surface and to provide at least one area with a sound generating device which is preferably also strip-shaped. With respect to the embodiment of the nozzles systems and the arrangement of the nozzles, the ultrasound devices, and the UV light sources and/or diffusors, reference is made to the aforementioned German Application 196 16 402 the disclosure of which is incorporated herewith by reference.

BRIEF DESCRIPTION OF THE DRAWINGS

The object and advantages of the present invention will appear more clearly from the following specification in conjunction with the accompanying drawing, in which.

DESCRIPTION OF PREFERRED EMBODIMENTS

The present invention will now be described in detail with the aid of several specific embodiments utilizing FIGS. 1 through 4.

Figure 1:
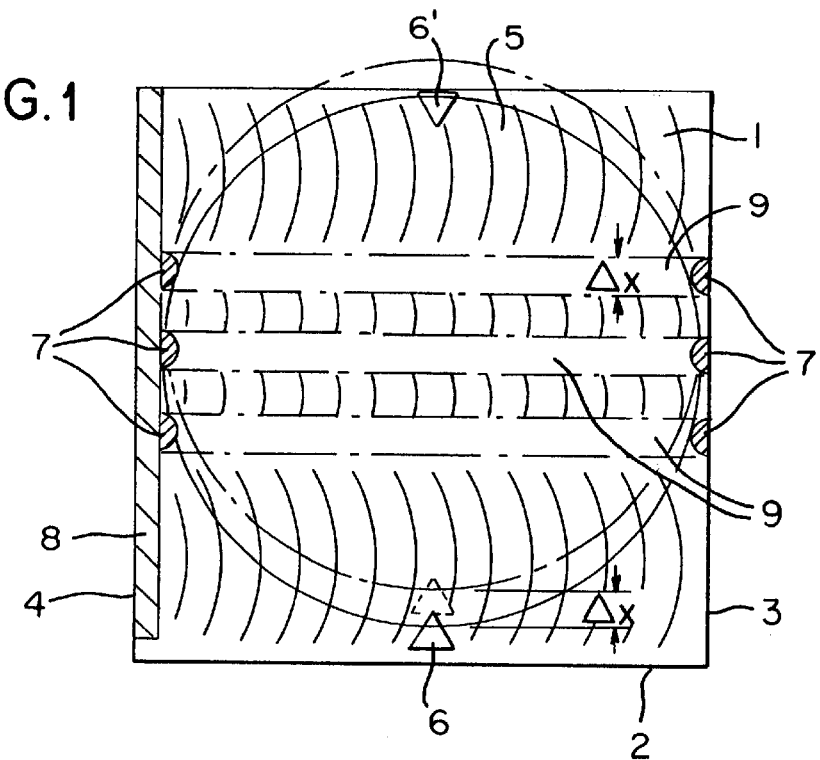
FIG. 1 is a schematic representation of an inventive device with lifting and lowering capability for the substrate receiving device and guide elements at the inner surfaces of the sidewalls of the fluid container.

FIG. 1 shows a fluid container 1 with a container bottom 2 and a container sidewall 3, 4 in cross-section. Within the fluid container 1 substrates 5 are positioned, for example, wafers. They are arranged in single file one after another and extend parallel to one another. The substrates 5 rest with their underside on a substrate receiving device 6 which in the shown embodiment is in the form of a comb-shaped stay positioned below the substrates 5. A substrate securing device 6' may be provided for securing the substrates at their upper edge.

Since the substrate receiving device 6 in the shown embodiment cannot secure the substrates 5 by itself and cannot hold them in an upright, parallel position relative to one another, the inner surfaces of the sidewalls 3, 4 of the fluid container 1 are provided with guides 7 for the wafers 5 which in the represented embodiment are shown as slotted stays and extend vertically relative to the wafer end faces. The guides 7 are positioned at the two oppositely arranged container sidewalls 3, 4 at the same level.

In the represented embodiment the entire sidewall 4 is embodied as an ultrasound generating device 8 that emits ultrasound, preferably megasound, in the horizontal direction. Due to the oppositely arranged guides 7, horizontal areas 9 with only minimal megasound intensity or without any intensity are present so that in these horizontal, strip-shaped areas 9 no or only a minimal sound exposure of the substrates 5 is possible.

According to the present invention, during the treatment process, i.e., during the irradiation of the substrates 5 with ultrasound, the substrate receiving device 6 is lifted and/or lowered (vertically reciprocated) so that a movement of the substrates 5 relative to the fluid container 1 and the fluid container elements, such as, for example, the guides 7 results. In this manner, due to the movement of the substrates 5, the areas 9 are also subjected to ultrasound; without movement of the substrates 5 the areas 9 could not be irradiated with ultrasound. The lifting stroke delta X by which the substrate receiving device 6 can be lifted and/or lowered, is selectable according to the respective requirements and specifications. In the shown embodiment, the lifting stroke should be substantially identical or greater than the width of the area 9 so that the entire area 9 during lifting or lowering of the substrate receiving device 6 will be within the emission range of the ultrasound generating device, i.e., within areas in which sound waves are emitted uninhibitedly.

Figure 2:
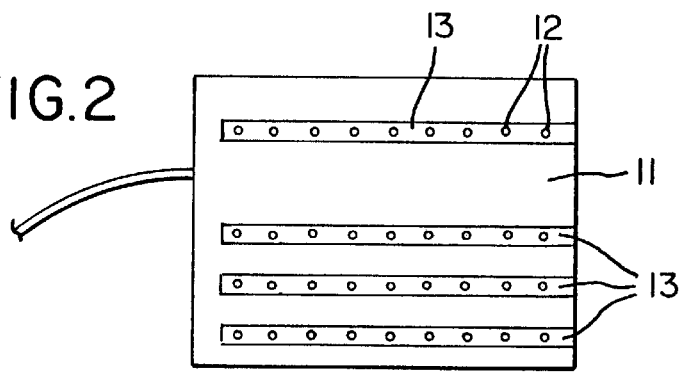
FIG. 2 shows an embodiment for the fluid bottom and/or at least one sidewall of the fluid container in a schematic representation.

In the embodiment represented in FIG. 2, the container bottom 2 and/or a sidewall 3, 4 is comprised of a continuous ultrasound generating device 11 whereby fluid nozzles 12 are positioned in parallel strips 13 or in cutouts of the ultrasound generating device. In the embodiment in which this arrangement is a container sidewall, at least one guide stay corresponding to the embodiment of the guide stay 7 of FIG. 1 is provided if the wafers 5 are not secured safely with the substrate receiving device alone.

Figure 3:
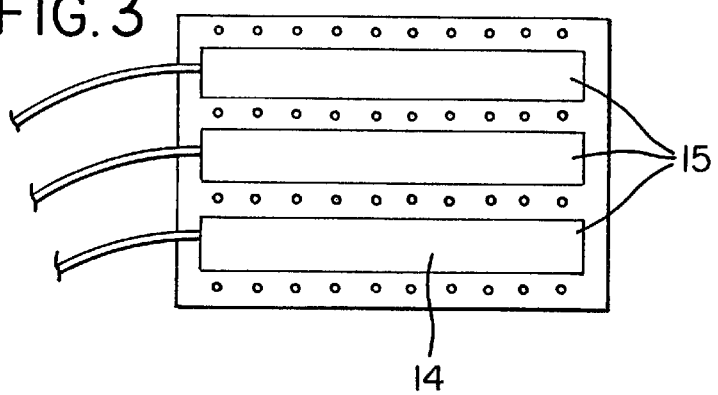
FIG. 3 shows a further embodiment of the fluid container bottom and/or at least one sidewall of the fluid container in a schematic representation.

In the embodiment represented in FIG. 3 a continuous container bottom and/or a continuous container sidewall is embodied as a fluid nozzle surface 14 as is, for example, disclosed in German application 196 16 402. Within such a fluid nozzle surface 14, areas 15 are provided that are embodied as strip-shaped ultrasound generating devices.

Figure 4:
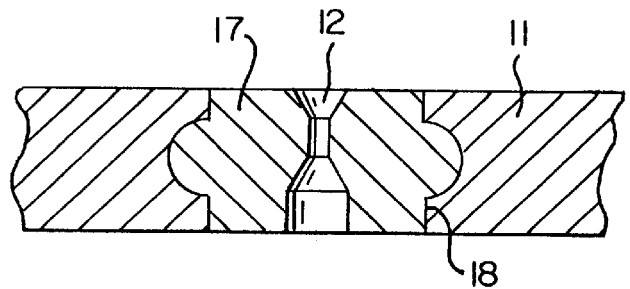
FIG. 4a shows an embodiment for attaching fluid nozzles in a sidewall of the fluid container according to FIG. 1 that is embodied as an ultrasound generating device.
FIG. 4b shows a second embodiment for attaching fluid nozzles directly within the ultrasound generating device.
Figure 4B:
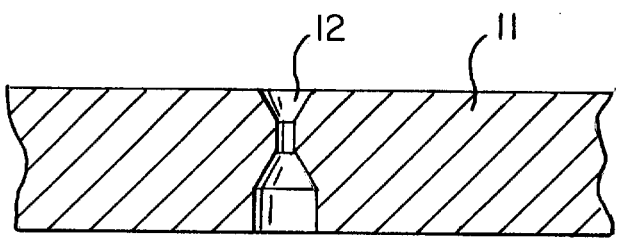
Figure 5A:
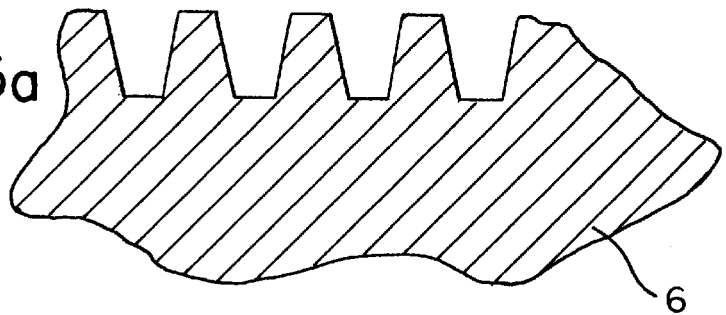
FIG. 5a shows one embodiment of slots of the substrate receiving element.
Figure 5B:
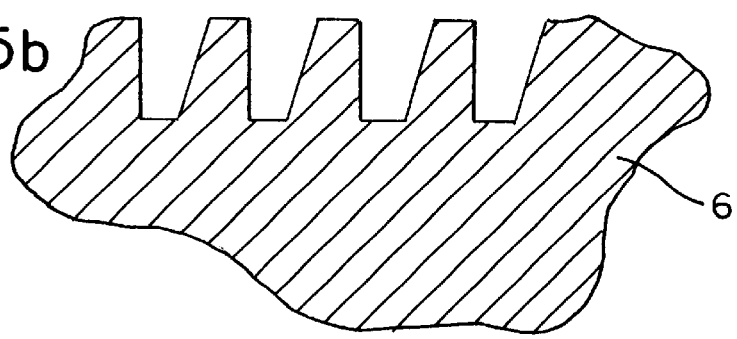
FIG. 5b shows another embodiment of the slots of the substrate receiving element.

FIG. 4 shows the profile of a strip-shaped cutout 18 in an ultrasound generating device 11 comprising a metal plate. A matching strip of metal or of an ultrasound-damping material 17, having fluid nozzles 12 arranged therein, is insertable into the metal plate.

The invention has been explained with the aid of preferred embodiments. However, to a person skilled in the art deviations and other embodiments are obvious without leaving the inventive concept. For example, the substrate receiving device 6 can be embodied such that the substrates 5 are secured in their position without requiring guides 7. An example for such an embodiment of the substrate receiving device is disclosed in German Application 196 16 402. Also, it is possible to provide the device with a hood for treating the substrates 5 with a vapor according to the Marongoni method in order to speed up the drying process of the substrates upon lifting the substrates from the fluid container.

The present invention is, of course, in no way restricted to the specific disclosure of the specification and drawings, but also encompasses any modifications within the scope of the appended claims.

What I claim is:

1. A treatment apparatus for treating substrates by ultrasound, said apparatus comprising:

a fluid container having sidewalls and a bottom;

a device for moving in a reciprocating manner the substrates within said fluid container during treatment;

guides for the substrates connected to an inner surface of at least one of said sidewalls, wherein the wafers are held in said container only by said guides and said device for moving;

wherein at least one of said bottom and said sidewalls has at least one portion embodied as an ultrasound generating device, subjecting the substrates in said fluid container to ultrasound.

2. An apparatus according to claim 1, wherein said device vertically moves the substrates.

3. An apparatus according to claim 1, wherein said device comprises at least one substrate receiving element connected within said fluid container and wherein the substrates are positioned on said substrate receiving element.

4. An apparatus according to claim 3, wherein said substrate receiving element is a stay positioned below the substrates such that the substrates rest on said stay, said stay extending perpendicularly to end faces of the substrates.

5. An apparatus according to claim 3, wherein said substrate receiving element comprises a holding area for the substrates.

6. An apparatus according to claim 5, wherein said substrate receiving element has at least two of said holding areas.

7. An apparatus according to claim 6, wherein said substrate receiving element comprises securing elements for securing the substrates.

8. An apparatus according to claim 6, wherein said substrate receiving element comprises slots.

9. An apparatus according to claim 8, wherein said slots have an opening and a bottom, wherein a width of said slots decreases from said opening to said bottom.

10. An apparatus according to claim 8, wherein each one of said slots has a first sidewall and a second sidewall and wherein said first sidewall extends vertically and said second sidewall is slanted.

11. An apparatus according to claim 1, wherein said guides are selected from the group consisting of slots, stays, pins, and knobs.

12. An apparatus according to claim 1, wherein said inner surface of said at least one sidewall comprises areas free of said guides.

13. An apparatus according to claim 12, wherein said areas free of said guides comprise treatment elements selected from the group consisting of inlet openings, spray nozzles, diffusors, and UV light sources.

14. An apparatus according to claim 1, further comprising at least one substrate securing device connected within said fluid container for securing the substrates at an upper edge thereof.

15. An apparatus according to claim 1, wherein said ultrasound generating device comprises areas having fluid nozzles attached thereto.

16. An apparatus according to claim 15, wherein said fluid nozzles are connected to said ultrasound generating device so as to allow sound transmission.

17. An apparatus according to claim 15, wherein said fluid nozzles and said ultrasound generating device are sound-insulated from one another.

18. An apparatus according to claim 15, wherein said fluid nozzles are positioned in a sound-proofing material.

19. An apparatus according to claim 18, wherein said sound-proofing material is strip-shaped and wherein said ultrasound generating device has matching strip-shaped cut-outs into which said sound-proofing material is inserted.

20. An apparatus according to claim 1, wherein at least one of said bottom and said sidewalls has a second portion comprising fluid nozzles.

21. An apparatus according to claim 20, wherein said fluid nozzles are connected to said ultrasound generating device so as to allow sound transmission.

22. An apparatus according to claim 20, wherein said fluid nozzles and said ultrasound generating device are sound-insulated from one another.

23. An apparatus according to claim 23, wherein said fluid nozzles are positioned in a sound-proofing material.

24. An apparatus according to claim 23, wherein said sound-proofing material is strip-shaped and wherein said ultrasound generating device has matching strip-shaped cut-outs into which said sound-proofing material is inserted.

* * * * *